United States Patent [19]
Ogasawara et al.

[11] Patent Number: 5,834,343
[45] Date of Patent: Nov. 10, 1998

[54] METHOD OF MANUFACTURING THIN FILM TRANSISTOR

[75] Inventors: Takao Ogasawara; Tsutomu Uemoto, both of Yokohama, Japan

[73] Assignee: Kabushiki Kaisha Toshiba, Kawasaki, Japan

[21] Appl. No.: 697,765

[22] Filed: Aug. 29, 1996

[30]   Foreign Application Priority Data

Aug. 31, 1995 [JP] Japan .................................... 7-223468
Jun. 10, 1996 [JP] Japan .................................... 8-147238

[51] Int. Cl.$^6$ .......................... H01L 21/00; H01L 21/425
[52] U.S. Cl. .......................... 438/154; 438/517; 438/527; 438/532; 438/540
[58] Field of Search ................ 437/21, 40 TFT, 437/41 TFT, 46; 438/517, 527, 530, 532

[56]         References Cited

U.S. PATENT DOCUMENTS 5,238,858  8/1993  Matsushita ............................ 438/521
5,244,820  9/1993  Kamata .................................. 437/20
5,348,897  9/1994  Yen ....................................... 438/152

OTHER PUBLICATIONS

Bruhl et al, "Generation of Residual Deformations by Pulsed Ion Implantation", J. Phys. D: Appl Phys., vol. 28 (1995), pp. 1655–1660 (No month).
Mishima et al, Implantation Temperature Effect on Polycrystalline Silicon by Ion Shower Doping, J. Appl Phys., vol. 74 No. 12, Dec. 15, 1993, pp. 7114–7117.

*Primary Examiner*—John Niebling
*Assistant Examiner*—Michael S. Lebetritt
*Attorney, Agent, or Firm*—Cushman Darby & Cushman IP Group of Pillsbury Madison & Sutro LLP

[57]         ABSTRACT

The method of manufacturing a thin film transistor, including the steps of: a first step, after a poly-crystal silicon film has been formed on a substrate (1), for forming a layer to be formed as an conductive layer (2a) for the thin film transistor by patterning the formed polycrystal silicon film; a second step for doping impurity ions at the layer to be formed as the conductive layer; a third step for cooling the substrate by a cooling mechanism after the second step; and a fourth step for forming a source region ($4a_1$) and a drain region ($4a_2$) in the conductive layer, respectively by repeating the second and third steps. By this method, impurities can be doped at microscopic regions, and further the highest possible throughput can be obtained.

15 Claims, 19 Drawing Sheets

RAW GAS

METHOD OF MANUFACTURING THIN FILM TRANSISTOR

BACKGROUND OF THE INVENTION

1. Field of the Invention

The present invention relates to a method of manufacturing a thin film transistor using a poly-crystal silicon as a conductive layer.

2. Description of the Prior Art

It is now possible to form poly-crystal silicon or amorphous silicon on a transparent substrate in accordance with CVD (chemical vapor deposition) technique, so that the poly-crystal silicon or amorphous silicon is now widely used in the field of liquid crystal display units. That is, the amorphous silicon is applied to switching elements of a pixel portion of a display section. Further, the application of the poly-crystal silicon film to a driving circuit (mainly composed of CMOS transistors) for activating the pixel switching element has been researched.

When the amorphous silicon is used as the conductive layer of a thin film transistor (referred to as TFT, hereinafter), since the treatment temperature during the manufacturing process is lower than 400° C., the TFTs can be formed on a large-sized glass substrate. In this case, there exists such an advantage that a large-sized display panel or a plurality of display panels can be obtained by a single glass substrate, since the mobility (the response speed) of the TFTs is small, there exists a problem in that the driving circuits cannot be formed integral with each other, with the result that it is difficult to micro-miniaturize the display panel.

On the other hand, when the poly-crystal silicon is used as a conductive layer of the TFT, although the mobility of the TFT is large and further the display panel can be well micro-miniaturized, since the process temperature is as high as 900° to 1000° C., a large-sized glass substrate (whose heat resistance temperature is as high as about 600° C.) is difficult to use, so that a quartz substrate of about 5 inch square has been widely used thus far. In the case of the quartz substrate, however, since a large-sized display panel or a plurality of display panels cannot be obtained from a single quartz panel, and since the quartz itself is costly, the reduction of the process temperature on condition that the glass substrate can be utilized has been so far researched. As a result, the processing temperature during the manufacturing process using the glass substrate can be reduced owing to the laser annealing method, with the result that the TFTs using polycrystal silicon as a conductive layer have been tried to be formed on a large-sized glass substrate actively.

A prior art method of manufacturing CMOS transistors using poly-silicon as a conductive layer of a TFT will be described in detail hereinbelow with reference to FIGS. 7A to 7D and FIGS. 8A to 8D. First, a poly-crystal silicon film is formed on an alkali-less substrate 1 in accordance with the CVD method, for instance, and the succeeding heat treatment process. After that, the substrate 1 is patterned in accordance with CDE (chemical dry etching) method to form a poly-crystal silicon film island 3a for an n-type TFT and a poly-crystal silicon film island 3b for a p-type TFT, as shown in FIG. 7A. Here, the islands 3a and 3b are both used as a conductive layer of both the n-type TFT and the p-type TFT, respectively. After that, a gate insulating film 5 is deposited over the entire surface of the substrate in accordance with the CVD method, also as shown in FIG. 7A.

After a metallic film has been sputtered on the gate insulating film 5, two gate electrodes 7a and 7b are formed by patterning the metallic film in accordance with the CDE method, as shown in FIG. 7B. Successively, a pure aluminum film 10 is formed over the entire surface of the substrate by sputtering, and the formed aluminum film 10 is allowed to remain only on the p-type TFT forming region in accordance with PEP (photo engraving process) and etching, as shown in FIG. 7C.

Phosphorus (P) ions are doped in self-alignment manner with the gate electrode 7a as a mask and by use of an ion doping system, to form an $n^+$ layer 4a in the conductive layer 3a, as shown in FIG. 7D. After the aluminum film 10 formed on the p-type TFT region has been removed by etching, another aluminum film 12 is formed over the entire substrate surface by sputtering, and this further formed aluminum film 12 is allowed to remain only on the e-type TFT forming region in accordance the PEP and etching, as shown in FIG. 8A.

Boron (B) ions are doped over the entire substrate surface in self-alignment process using the gate electrode 7b as a mask and by use of an ion doping system, to form a $p^+$ layer 4b in the conductive layer 3b, as shown in FIG. 8B. After the aluminum film 12 formed on the n-type TFT region has been removed by etching, another insulating film 13 is deposited over the entire substrate surface, as shown in FIG. 8C. Further, some contact holes are opened in this insulating film 13, and the formed contact holes are buried with a metallic film to form signal lines 15. Thus, CMOS transistors are completed, as shown in FIG. 8D.

In the prior art manufacturing process of the TFTs, however, when the poly-crystal silicon is used, since the process temperature is high, a quartz substrate of about 5 inch square has been mainly used, as already explained. In this case, the ion implanter has been used to dope impurities, and further a photoresist has been used as the mask when impurities are doped. However, when the TFTs using poly-crystal silicon as the conductive layer are formed on a large-sized glass substrate, the ion doping system is used, instead of the ion implanter. In addition, aluminum is used as the mask material, instead of the photoresist. The reason is as follows:

In the case of the ion implanter, impurity ions are focused as a beam; the focused ion beam is accelerated; and the substrate is scanned by the accelerated ion beam to dope the impurities. Accordingly, as the substrate size increases or as the doping rate increases, the processing time for each substrate increases. In contrast, in the case of the ion doping system, impurities are ionized in a chamber; the ionized impurities are accelerated without being focused; and the entire surface of the substrate can be doped simultaneously. Accordingly, a large-sized substrate can be doped at a high concentration in a short time. This is the reason why the ion doping system is used for a large-sized substrate.

During the impurity doping, since the accelerated impurities collide with atoms for constituting the substrate and the TFTs, the substrate temperature increases. Therefore, the ion implanter and the ion doping system are both provided with a substrate cooling mechanism. In the case where the substrate is formed of glass, since the thermal conductivity of glass is low, it is impossible to perfectly prevent a rise in temperature on the glass substrate. That is, the substrate temperature rises with increasing beam current and increasing acceleration voltage.

On the other hand, in the case of the ion implanter, the beam current can be easily controlled. When the 5-inch substrate is used, since the heat capacity thereof is small because of the small-sized substrate, the photoresist can be used.

In contrast, in the case of the ion doping system, since the beam current is difficult to control and further since the size of the used substrate is large, the heat capacity of the substrate is also large, so that the substrate temperature increases as high as 300° to 400° C. according to the conditions. On the other hand, since the heat resistance temperature of the ordinary photoresist is as low as 130° C., it is impossible to use the photoresist to form the TFTs on a large-sized substrate. This is the reason why the aluminum mask is used together with the ion doping system.

As described above, conventionally, when the TFTs of poly-silicon are formed on a large-sized substrate, the ion doping system and the aluminum mask have been used thus far. In this case, however, the following problems arise.

The first problem is that the number of manufacturing steps increases for the reason as follows: when the photoresist is used as the mask, the photoresist is patterned in accordance with an application process by a spin coater, a light exposure process, and a PEP (photo engraving process) for development by alkali liquid. Further, after the impurity doping ends, the photoresist can be removed easily by ashing using oxygen gas. In contrast, in the case where aluminum is used as a mask, after aluminum has been sputtered over the entire surface of the substrate; a photoresist is applied on the resulting aluminum film; and the applied photoresist is patterned. After the aluminum has been patterned with this photoresist as a mask, the resist pattern is removed. Therefore, when the aluminum mask is used, the number of PEP steps increases by one, as compared with the case where the photoresist is used as a mask.

The other problem relates to patterning precision. The feature of the TFTs formed of poly-crystal silicon is that the TFTs can be micro-miniaturized at high precision. Accordingly, in the TFTs, a processing precision as high as 2 to 3 $\mu$m is required. This high precision can be attained relatively easily only when the photoresist mask is used. In the case where an aluminum mask is used, the processing precision inevitably deteriorates, in comparison with the case where the photoresist mask is used. This is because in the case of the aluminum mask, since the photoresist is used to form the aluminum mask, there inevitably exists a misalignment between the two masks. In addition, in the case of the aluminum patterning, since isotropic wet etching is used, the processing precision obtained when the aluminum mask is used deteriorates as compared with that obtained when the photoresist mask is used. As a result, when the aluminum mask is used, doping at a microscopic region becomes difficult.

SUMMARY OF THE INVENTION

With these problems in mind, therefore, it is the object of the present invention to provide a method of manufacturing thin film transistors, by which impurities can be doped at microscopic regions and further the maximum possible throughput can be obtained.

To achieve this objective, the present invention provides a method of manufacturing a thin film transistor, comprising the steps of: (1) forming a poly-crystal silicon film on a substrate for forming a conductive layer for the thin film transistor by patterning the formed polycrystal silicon film; (2) doping impurity ions at the layer to be formed as the conductive layer; (3) cooling the substrate by a cooling mechanism after the second step; and (4) forming a source region and a drain region in the conductive layer, respectively by repeating the second and third steps.

Since the impurity doping and the substrate cooling are repeated, it is possible to prevent the substrate temperature from rising up to a temperature (e.g., the heat resistance temperature of the photoresist), so that it is possible to use the photoresist (whose processing precision is high) as a mask during the doping. Further, since the number of total steps can be reduced, as compared with when an aluminum mask is used, it is possible to increase the throughput, as compared with known manufacturing methods.

According to the present invention, a weak doping can be preferably performed, when the substrate is being cooled.

It is also possible to perform doping on the basis of temperature of the substrate, in such a way that doping is interrupted when the substrate temperature reaches a predetermined temperature below the temperature at which photoresist is not hardened.

It is also possible to perform the doping intermittently at time intervals according to the cooling cycle.

It is also possible to cool the substrate by cooling a reverse side of the substrate by use of cooling water; by blowing a cooling gas onto a surface of the substrate; by exposing the reverse side of the substrate in a gas atmosphere including hydrogen gas.

DETAILED DESCRIPTION OF THE PREFERRED EMBODIMENTS

A first embodiment of the thin film transistor manufacturing method according to the present invention will be described hereinbelow with reference to FIGS. 1 to 6.

Figure 2:
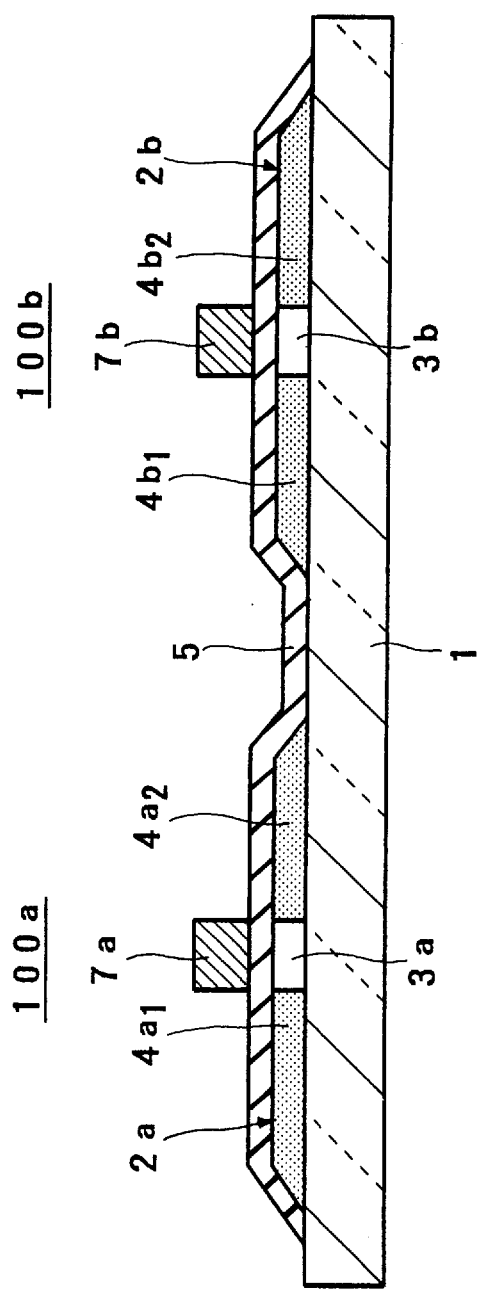
FIG. 2 is a cross-sectional view showing the thin film transistors manufactured in accordance with the first embodiment of the invention.

FIG. 2 shows a cross section of two thin film transistors (referred to as TFTs, hereinafter) manufactured in accordance with the first embodiment. In FIG. 2, two CMOS type TFTs composed of an n-type TFT 100a and a p-type TFT 100b are formed on a large-sized glass substrate 1. The essential portions of these two TFTs are formed by a conductive layer 2a/2b formed of poly-crystal silicon film having a thickness of 50 nm, for instance and formed on the glass substrate 1, a gate insulating film 5 for covering the conductive layer 2a/2b, and two gate electrodes 7a and 7b.

The conductive layer 2a is composed of a channel layer 3a formed under the gate electrode 7a, a source region $4a_1$ and a drain region $4a_2$ both formed so as to sandwich the gate electrode 7a. In the same way, the conductive layer 2b is composed of a channel layer 3b formed under the gate electrode 7b, a source region $4b_1$ and a drain region $4b_2$ both formed so as to sandwich the gate electrode 7b.

Further, the gate insulating film 5 is formed of $SiO_2$, for instance, and the film thickness thereof is about 100 nm or less, preferably. This gate insulating film 5 can be formed in accordance with CVD method. Further, the gate electrodes 7a and 7b are formed of a metallic film, and the film thickness thereof is about 200 nm, for instance.

Here, the source regions $4a_1$ and $4b_1$ and the drain regions $4a_2$ and $4b_2$ are formed in the conductive layer 2a/2b, respectively by use of an ion doping system, and further a photoresist mask is used during ion doping, as described in further detail below.

Figure 5:
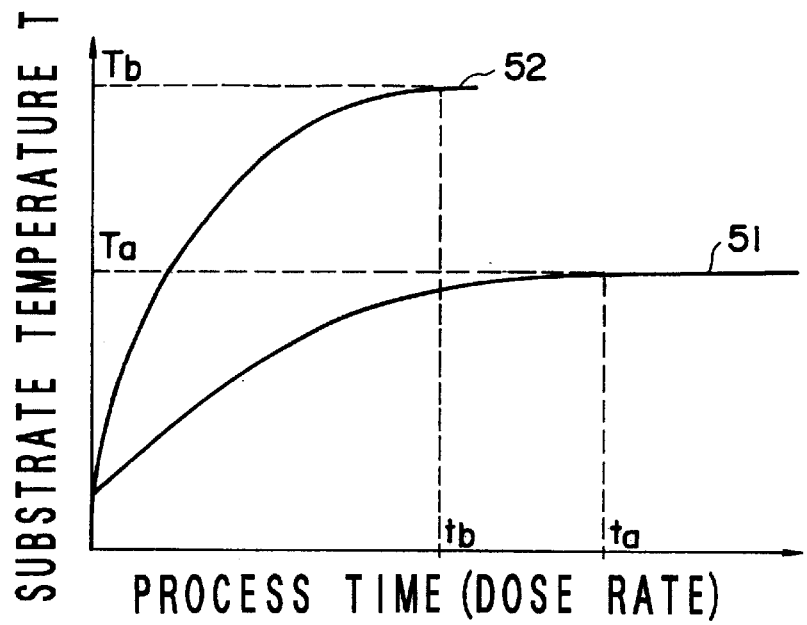
FIG. 5 is a graphical representation for explaining the effect of the first embodiment of the invention.

FIG. 5 shows the change of the substrate temperature T obtained when P ions are doped onto the glass substrate by use of the ion doping system. In FIG. 5, the abscissa indicates the processing time, that is, the dose of the impurities. A graphical curve 51 shows the substrate temperature (T) characteristics obtained when P ions are doped at an acceleration voltage of 30 KeV and a beam current of 1 $\mu A/cm^2$. This curve 51 indicates that the substrate temperature increases as the impurity doping proceeds and reaches the maximum temperature Ta, when a time ta has elapsed after the start of the doping; and then kept constant after the time ta. On the other hand, a graphical curve 52 shows the substrate temperature (T) characteristics obtained when P ions are doped at an acceleration voltage of 30 KeV and a beam current of 5 $\mu A/cm^2$. This curve 52 indicates that the substrate temperature increases as the impurity doping proceeds and reaches the maximum temperature Tb (>Ta), when a time tb (<ta) has elapsed after the start of the doping. As understood by the characteristics shown in FIG. 5, the substrate temperature T increases with increasing beam current.

Figure 6:
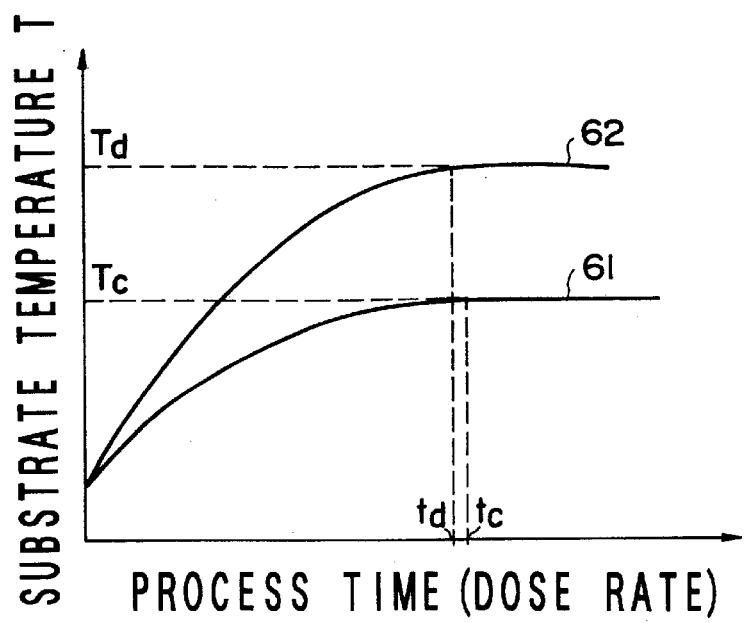
FIG. 6 is another graphical representation for explaining the effect of the first embodiment of the invention.
Figure 7A:
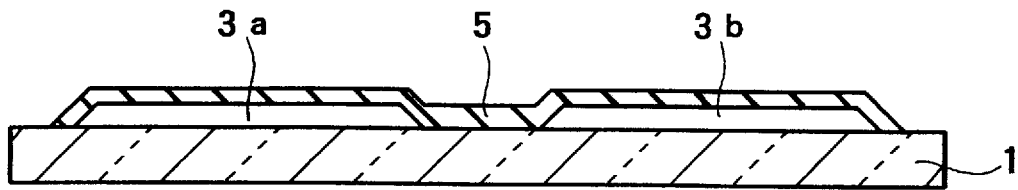
FIGS. 7A to 7D are cross-sectional views for explaining the prior art thin film transistor manufacturing method.
Figure 7B:
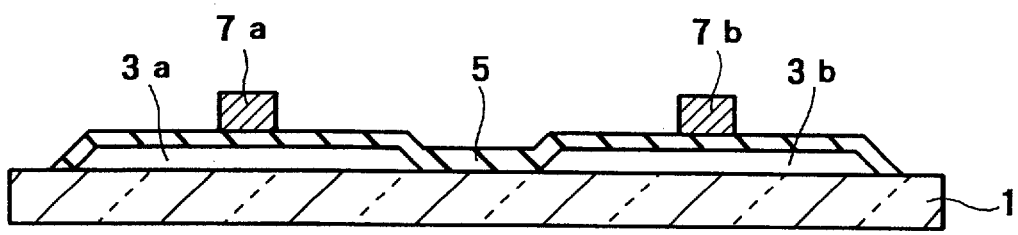
Figure 7C:
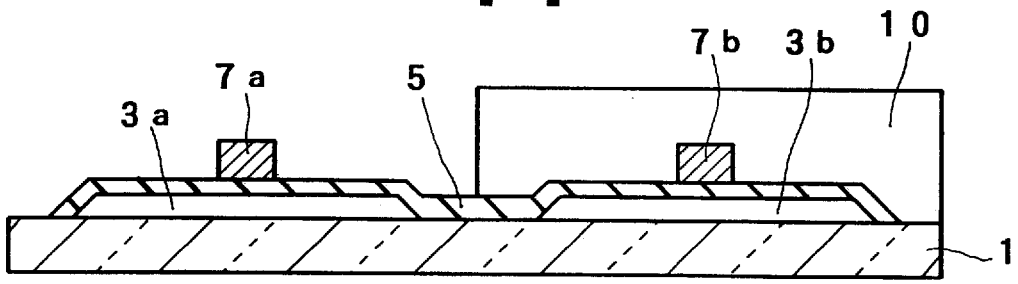
Figure 7D:
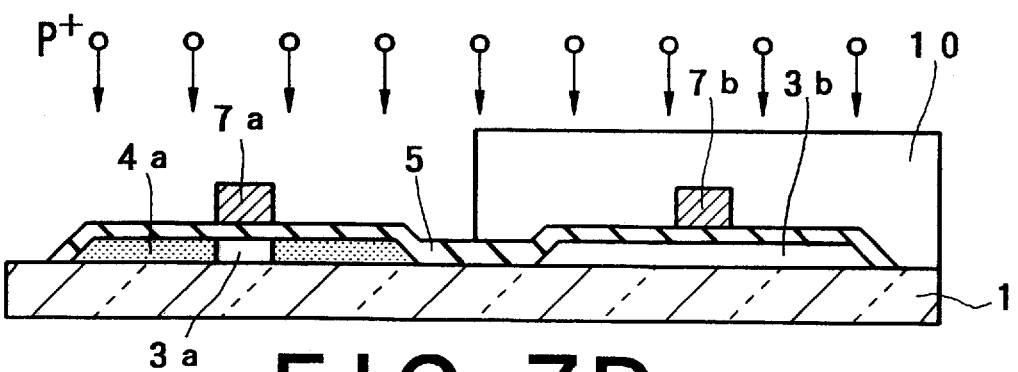
Figure 8A:
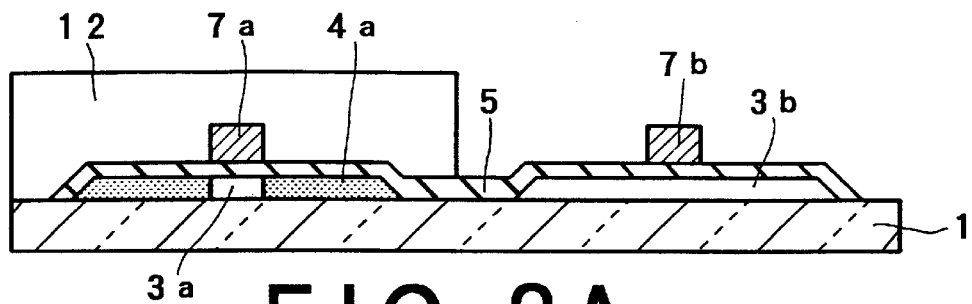
FIGS. 8A to 8D are cross-sectional views for explaining the prior art thin film transistor manufacturing method.
Figure 8B:
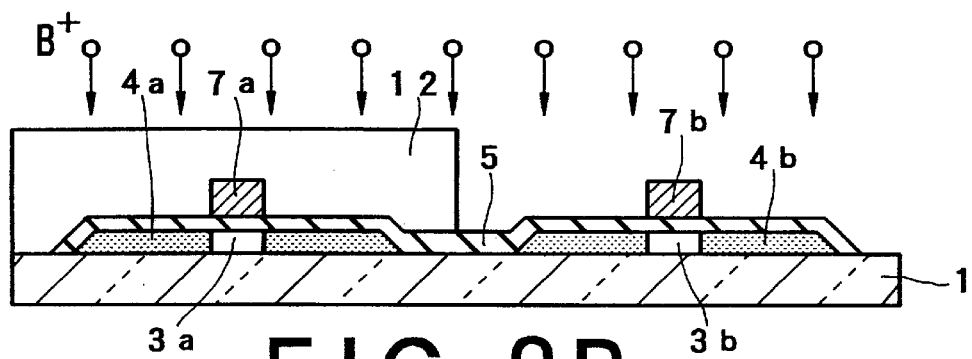
Figure 8C:
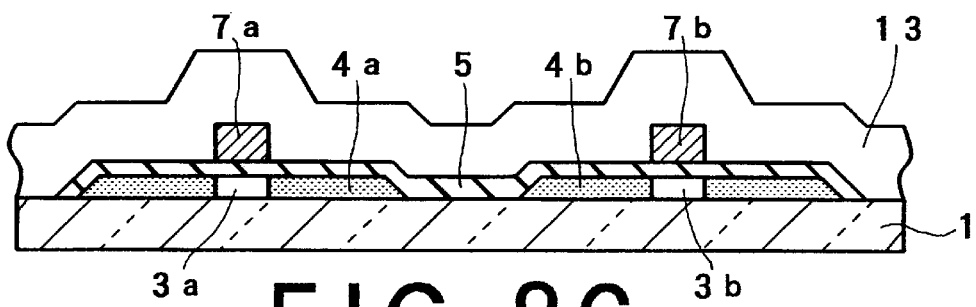
Figure 8D:
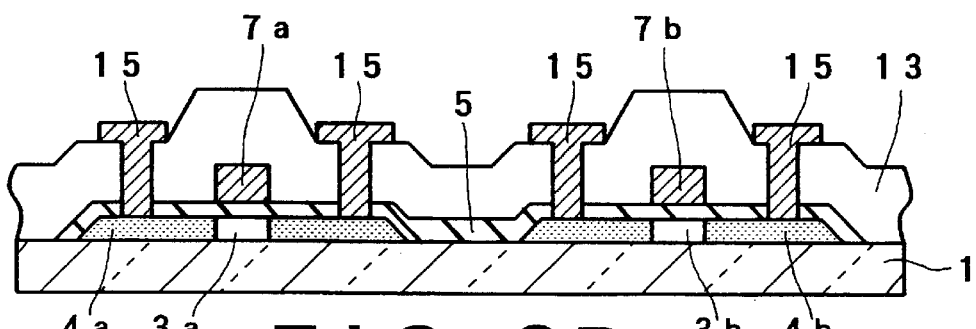

FIG. 6 shows the change of the substrate temperature T obtained when P ions are doped on the glass substrate at two acceleration voltages of 10 KeV and 50 KeV, without changing the beam current (e.g., beam current is kept at 1 $\mu A/cm^2$) by use of the ion doping system. A graphical curve 61 shows the substrate temperature (T) characteristics obtained when P ions are doped at an acceleration voltage of 10 KeV and a beam current of 1 $\mu A/cm^2$. This curve 61 indicates that the substrate temperature reaches the maximum temperature Tc when a time tc has elapsed after the start of the doping. On the other hand, a graphical curve 62 shows the substrate temperature (T) characteristics obtained when P ions are doped at an acceleration voltage of 50 KeV and a beam current of 1 $\mu\mu A/cm^2$. This curve 62 indicates that the substrate temperature reaches the maximum temperature Td (>Tc) when a time td (<tc) has elapsed after the start of the doping. As understood by the characteristics shown in FIG. 6, when the beam current is kept constant, the time required for the substrate temperature T to reach the maximum temperature decreases with increasing acceleration voltage.

FIGS. 5 and 6 indicate that the rise in substrate temperature is subjected to the influence of the acceleration voltage and the beam current during the impurity doping, and further that a time is necessary from when the impurity doping starts to when the substrate temperature reaches the maximum temperature.

Accordingly, when impurities are doped to a TFT having a poly-crystal silicon layer formed on an alkali-less glass substrate and used as a conductive layer, by use of the ion doping system, if the beam current can be controlled so as not to increase beyond a predetermined value, and further if the substrate temperature can be prevented from being heated beyond the heat resistance temperature of photoresist (a limit temperature at which the photoresist is not excessively hardened into brittleness (about 130° C.)) by irradiating the beam intermittently according to the substrate temperature, it is possible to adopt the photoresist even if the ion doping system is used.

Figure 1:
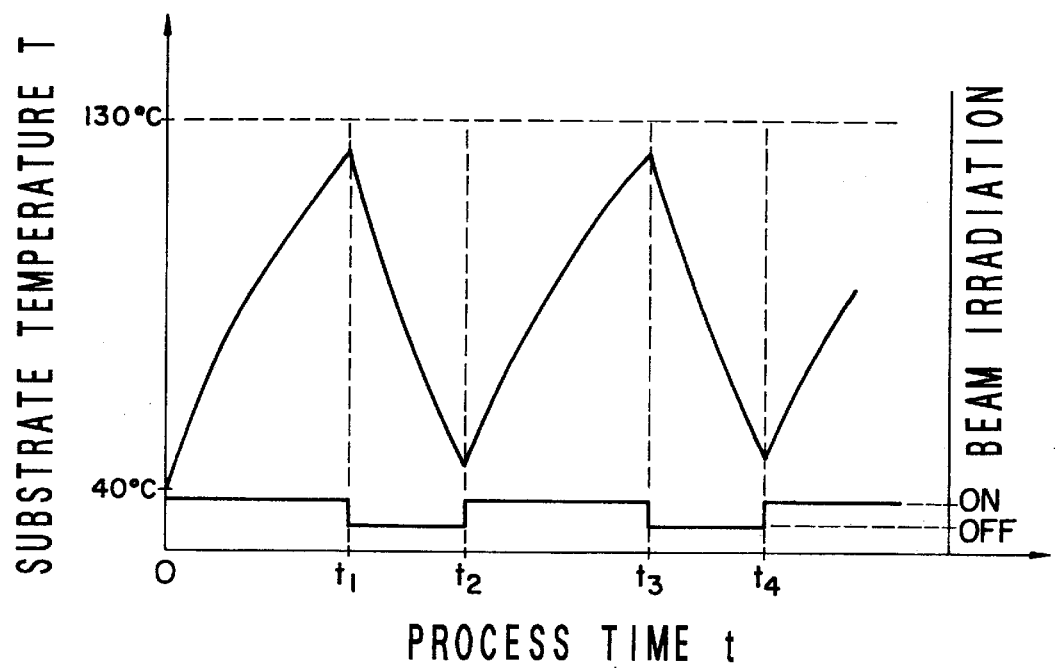
FIG. 1 is a graphical representation showing doping characteristics of a first embodiment of the thin film transistor manufacturing method according to the present invention.

In more detail, as shown in FIG. 1 in which the abscissa designates the time t which has elapsed after the doping start, when doping irradiation starts from a time t=0, the substrate temperature begins rising. Here, when the substrate temperature rises up to a temperature (e.g., 120° C.) near the photoresist heat resistance temperature (about 130° C.) (e.g., at a time $t_1$), the beam irradiation is interrupted. Then, since the substrate is cooled by a substrate cooling mechanism provided for the ion doping system, the substrate temperature begins falling. Therefore, when the substrate temperature drops down to about 40° C. (e.g., a time $t_2$), the beam is irradiated again to restart the impurity doping. By repeating the above beam intermittent irradiation, it is possible to dope impurities on the glass substrate formed with a photoresist mask by use of the ion doping system.

The first embodiment of the manufacturing method according to the present invention will be described hereinbelow with reference to FIGS. 3A to 3D and FIGS. 4A to 4D. The manufacturing method of this first embodiment is different from the prior art manufacturing method as explained with reference to FIGS. 7A to 7D and FIGS. 8A to 8D in that during the ion doping, two photoresist masks 9 and 11 are used instead of the aluminum masks 10 and 12 and further in that the substrate temperature is heated by irradiating an ion beam intermittently as shown in FIG. 1, for instance. Further, in contrast to the prior art method, in the first embodiment of the present invention, a mechanism for detecting the substrate temperature is required.

Figure 3A:
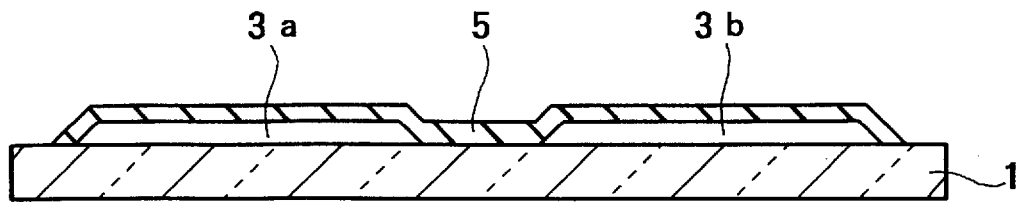
FIGS. 3A to 3D are cross-sectional views for explaining the first embodiment of the invention.

First, a poly-crystal silicon film is formed on an alkali-less substrate 1 in accordance with the CVD method, for instance and the succeeding heat treatment process. Further, the substrate 1 is patterned in accordance with CDE (chemical dry etching) method to form a poly-crystal silicon film island 3a for an n-type TFT and a poly-crystal silicon film island 3b for a p-type TFT, as shown in FIG. 3A. Here, the islands 3a and 3b are both used as a conductive layer of both the n-type TFT and the p-type TFT, respectively. After that, a gate insulating film 5 is deposited over the entire substrate surface in accordance with the CVD method, also as shown in FIG. 3A.

Figure 3B:
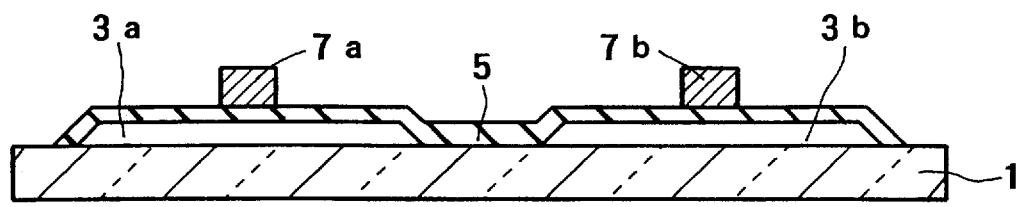
Figure 3C:
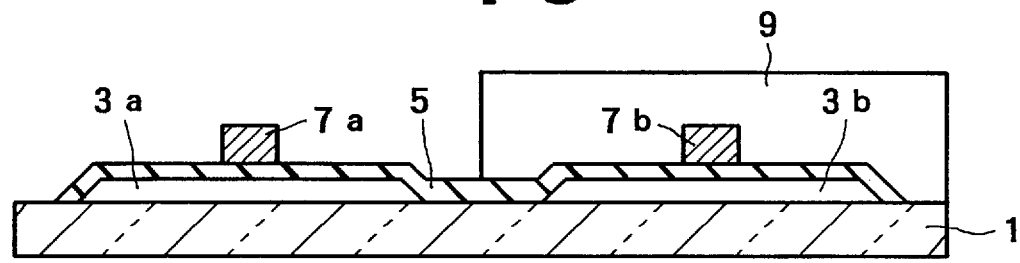

After a metallic film has been sputtered on the gate insulating film 5, two gate electrodes 7a and 7b are formed by patterning the metallic film in accordance with the CDE method, as shown in FIG. 3B. Successively, a photoresist is applied to the entire substrate surface, and further the formed photoresist is allowed to remain only on the p-type TFT forming region in accordance with PEP (photo engraving process), as shown in FIG. 3C.

Figure 3D:
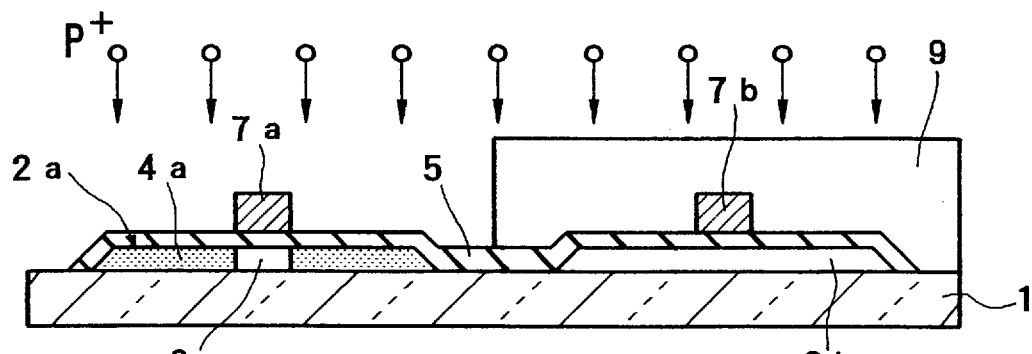

Phosphorus (P) ions are doped in self-alignment manner with the gate electrode 7a as a mask and by use of the ion doping system, to form an $n^+$ layer 4a in the conductive layer 3a, as shown in FIG. 3D. In this process, the doping is effected by the ion doping system intermittently on the basis of the substrate temperature as shown in FIG. 1.

Figure 4A:
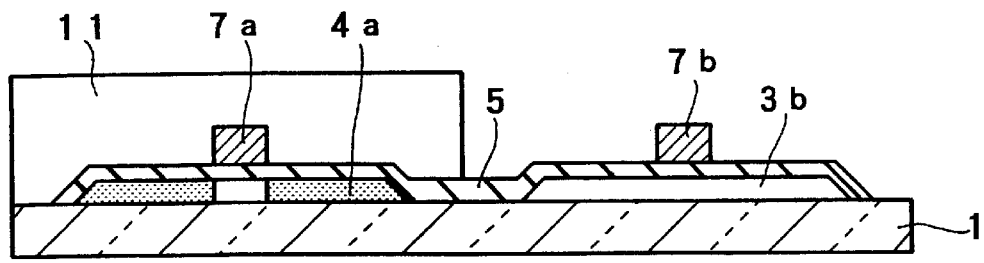
FIGS. 4A to 4D are cross-sectional views for explaining the first embodiment of the invention.

After the photoresist film 9 formed on the p-type TFT region has been removed, another photoresist film is applied, and the formed photoresist film 11 is allowed to remain only on the p-type TFT forming region in accordance with the PEP, as shown in FIG. 4A.

Figure 4B:
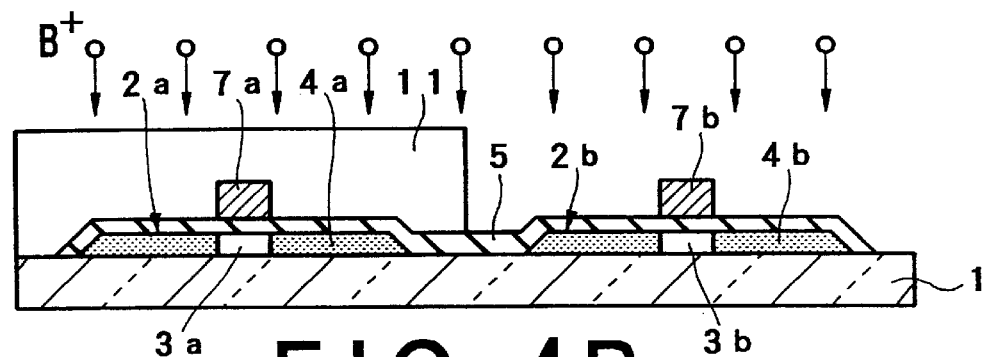

Boron (B) ions are doped in self-alignment manner with the gate electrode 7b as a mask and by use of an ion doping system, to form a $p^+$ layer 4b in the conductive layer 3b, as shown in FIG. 4B. In this process, the doping is effected by the ion doping system intermittently on the basis of the substrate temperature as shown in FIG. 1.

Figure 4C:
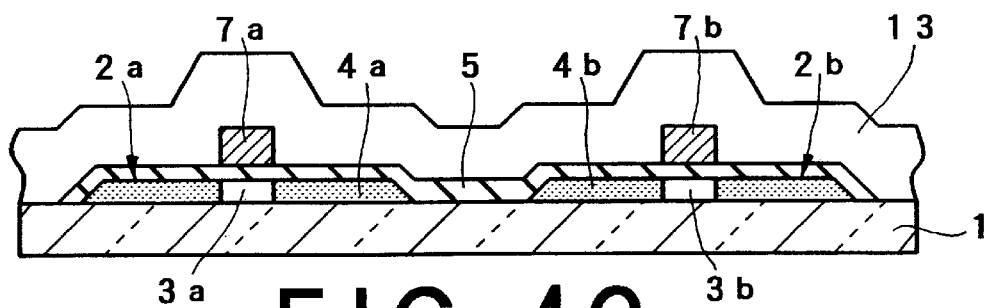
Figure 4D:
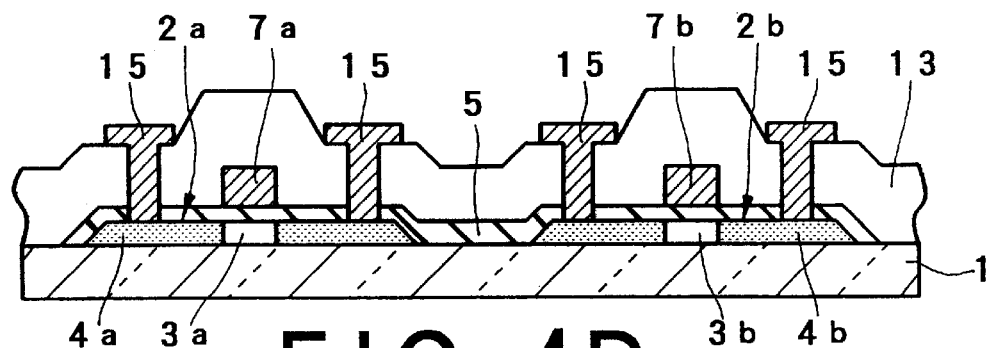

After the photoresist film 11 formed on the n-type TFT region has been removed, another insulating film 13 is deposited over the entire substrate, as shown in FIG. 4C. Further, some contact holes are opened in this insulating film 13, and the formed contact holes are buried with a metallic film to form signal lines 15. Thus, CMOS transistors can be completed, as shown in FIG. 4D.

In the first embodiment, the doping is effected by controlling the acceleration of the impurity ions in such a way that a peak of the impurity profile obtained after doping can be located in the area of the gate insulating film 5 or in the vicinity of an interface between the gate insulating film 5 and the conductive layer 2a/2b.

For instance, in order to locate the peak of the impurity profile at an interface between the gate insulating film 5 and the conductive layer 2a/2b on the condition that the film thickness of the gate insulating film 5 is 70 nm, the acceleration energy is 70 KeV in the case of P ions and 50 KeV in the case of $B_2$ ions.

As described above, in this first embodiment, since the beam current is irradiated intermittently during the ion doping by use of the ion doping system, it is possible to prevent the substrate temperature from rising beyond the heat resistance temperature of the photoresist, so that the photoresist can be used during ion doping. In this case, since the processing precision is high when the photoresist is used, it is possible to dope impurities even at microscopic regions.

In addition, since the beam current is irradiated intermittently, although a longer processing time is required in ion doping, as compared with when the aluminum mask is used, in the first embodiment, since the photoresist mask can be used, the total number of the manufacturing steps can be reduced, as compared with the manufacturing method using the aluminum mask, with the result that the throughput can be increased, as compared with the prior art manufacturing method.

Further, in the first embodiment, the ion doping is not effected when the substrate is being cooled. Without being limited thereto, doping can be effected weakly even when the substrate is being cooled. The weak doping during cooling will be explained in further detail hereinbelow.

A second embodiment of the this film transistor manufacturing method will be described hereinbelow with reference to FIG. 9.

Figure 9:
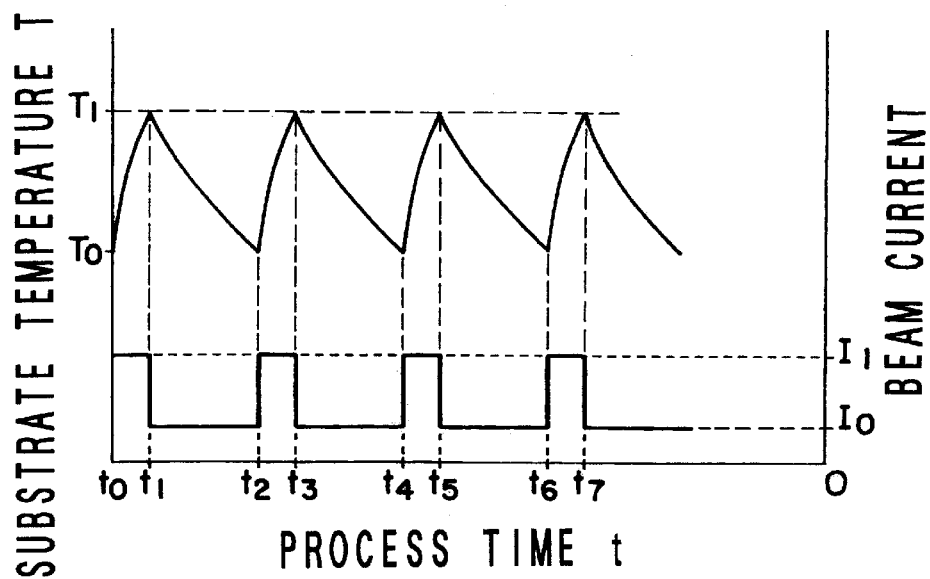
FIG. 9 is a graphical representation showing ion doping characteristics of a second embodiment of the invention.

FIG. 9 is a graphical representation showing the ion doping characteristics of the second embodiment. In the same way as with the case of the first embodiment, in this second embodiment, the conductive layer formed of poly-crystal silicon is formed on the glass substrate; the insulating film is formed on the conductive layer; and further the gate electrodes are formed on the gate insulating film. Further, when the impurities are doped in self-alignment manner with the gate electrodes as masks, respectively by use of the ion doping system, the doping is effected in accordance with the doping characteristics as shown in FIG. 9.

In more detail, the beam current is set to a higher current value $I_1$ (at a time $t_0$) for beam irradiation. Then, the substrate temperature rises from the temperature $T_0$. Here, when the substrate temperature reaches a temperature $T_1$ (at a time $t_1$) determined below the heat resistance temperature of the photoresist used as the mask during the ion doping, the beam current is set to a lower value $I_0$ ($<I_1$) for weak doping. At the same time, in the same way as with the case of the first embodiment, the substrate is cooled by use of the substrate cooling mechanism. Further, when the substrate temperature falls and reaches $T_0$ (at a time $t_2$), the beam current is set to a higher value $I_1$ again for doping, while interrupting the operation of the cooling mechanism. Then, the substrate temperature begins to rise again.

By repeating the above operation, the impurities can be doped to the conductive layer, to form the source and drain regions in the conductive layer.

In the above-mentioned second embodiment, since the substrate can be doped weakly even when the substrate is being cooled, a higher throughput can be obtained, as compared with that of the first embodiment. Further, in the same way as with the case of the first embodiment, since the photoresist can be used as the mask during doping, it is possible to dope the impurities to the microscopic regions.

Figure 10:
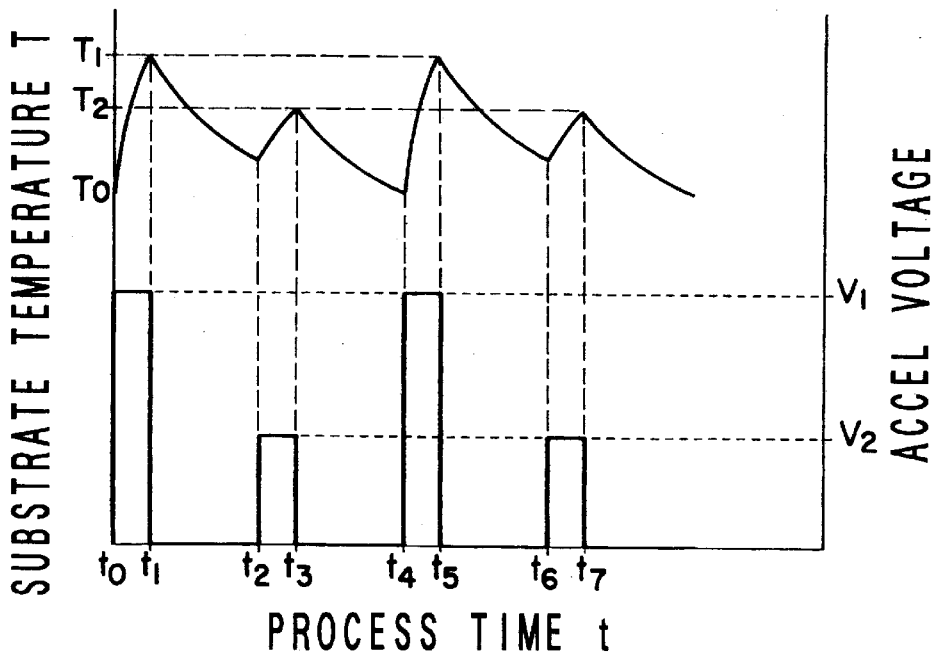
FIG. 10 is a graphical representation showing ion doping characteristics of a third embodiment of the invention.

A third embodiment of the thin film transistor manufacturing method will be described hereinbelow with reference to FIG. 10, in which the ion doping characteristics of the third embodiment are shown.

In this third embodiment, when the substrate is being heated, that is, not being cooled (e.g., a period between $t_0$ and $t_1$) in the manufacturing process of the first embodiment, the acceleration voltage of the ion doping system is set to a high voltage value $V_1$ (at a time period between $t_0$ and $t_1$) for a strong beam irradiation. Further, when the substrate is being cooled (e.g., a period between $t_1$ and $t_4$), the acceleration voltage of the ion doping system is set to a low voltage value $V_2$ ($<V_1$), only during a time period (e.g., a time period between $t_2$ and $t_3$), for a weak beam irradiation. Further, in this embodiment, during the periods other than the cooling period (e.g., between $t_1$ and $t_2$ and between $t_3$ and $t_4$), the acceleration voltage is set to zero.

When the high acceleration voltage $V_1$ is applied during the period between $t_0$ and $t_1$, the substrate temperature rises from the temperature $T_0$ to a temperature $T_1$ (at a time $t_1$) determined below the heat resistance temperature of the photoresist used as the mask during the ion doping. When the substrate temperature reaches this temperature $T_1$ and thereby the high acceleration voltage $V_1$ is set to zero, the substrate is cooled by the cooling mechanism. Further, when the substrate falls and reaches a temperature between T2 and T0, the acceleration voltage is set to the low voltage $V_2$ (at a time $t_2$) again for the weak doping. The weak doping is kept until the substrate temperature reaches a temperature $T_2$ ($\leq T_1$) (at a time $t_3$). Further, during the weak doping, the substrate is kept cooled by the cooling mechanism. Further, when the weak doping ends, the acceleration voltage is set to zero again. When the substrate is cooled by the cooling mechanism down to $T_0$ (at a time $t_4$), the cooling mechanism is interrupted, and the acceleration voltage is set to the high voltage $V_1$ again.

By repeating the above operation, the impurities can be doped to the conductive layer, to form the source and drain regions in the conductive layer.

In the above-mentioned third embodiment, since the substrate can be doped weakly even when the substrate is being cooled, a higher throughput can be obtained, as compared with that of the first embodiment. Further, in the same way as with the case of the first embodiment, since the photoresist can be used as the mask during doping, it is possible to dope the impurities to the microscopic regions.

In the above-mentioned third embodiment, although the weak doping is effected only once during the one cooling period of the substrate (e.g., during the period between $t_1$ and $t_2$), it is possible to effect the weak doping several times during one cooling period.

A fourth embodiment of the thin film transistor manufacturing method will be described hereinbelow with reference to FIGS. 11A to 11D and FIGS. 12A to 12B. In this fourth embodiment, two CMOSFETs having a conductive layer formed of polycrystal silicon of LDD (lightly doped drain) structure can be manufactured.

Figure 11A:
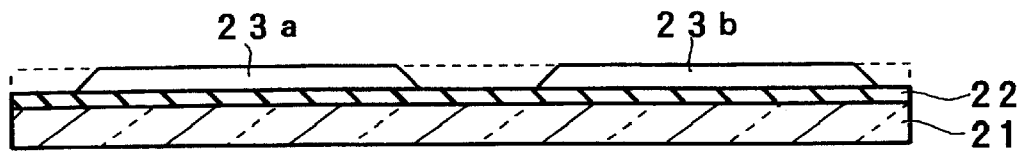
FIGS. 11A to 11D are cross-sectional views for explaining a fourth embodiment of the invention.

First, after an under-coat film 22 formed of $SiO_2$ has been formed on a glass substrate 21, an amorphous silicon film is deposited in accordance with PECVD (Plasma-enhanced Chemical Vapor Deposition) method. Further, the formed amorphous silicon film is irradiated with an excimer laser to change the amorphous silicon film to a poly-crystal silicon layer 23, as shown in FIG. 11A. Further, the polycrystal silicon film 23 is patterned to form an n-type TFT polycrystal silicon film island 23a and a p-type TFT polycrystal silicon film island 23b. The two formed islands 23a and 23b become a conductive layer for both the n-type and p-type TFTs, respectively.

Further, a gate insulating film 24 formed of $SiO_2$ having a thickness of 100 nm is formed on the two islands 23a/23b.

Figure 11B:
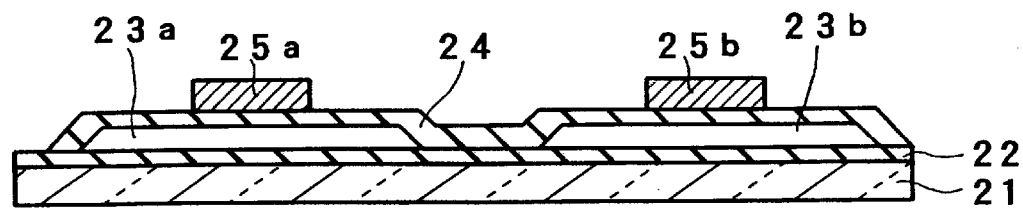
Figure 11C:
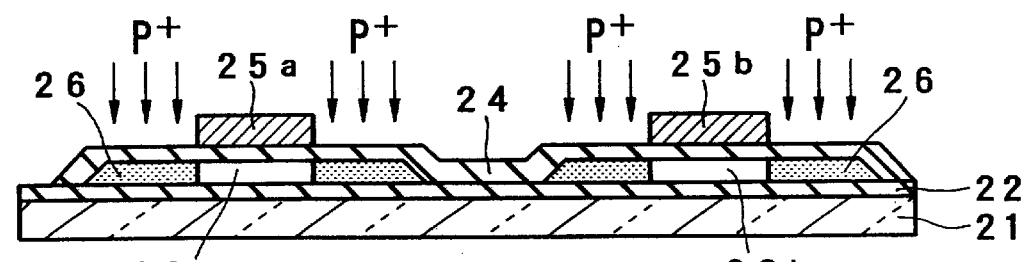

Further, a metallic film formed of MoTa is deposited by sputtering, and then the formed metallic film is patterned to form two gate electrodes 25a and 25b, as shown in FIG. 11B. Further, P ions are doped at a doping rate of $1 \times 10^{13}$ $cm^{-2}$ with the gate electrodes 25a and 25b as masks, respectively and by use of the ion doping system, to form a low concentration impurity implantation layer 26 in the polycrystal silicon film 23a/23b, as shown in FIG. 11C. Further, in this process, doping is effected in accordance with one of the doping methods as explained in the first to third embodiments.

Figure 11D:
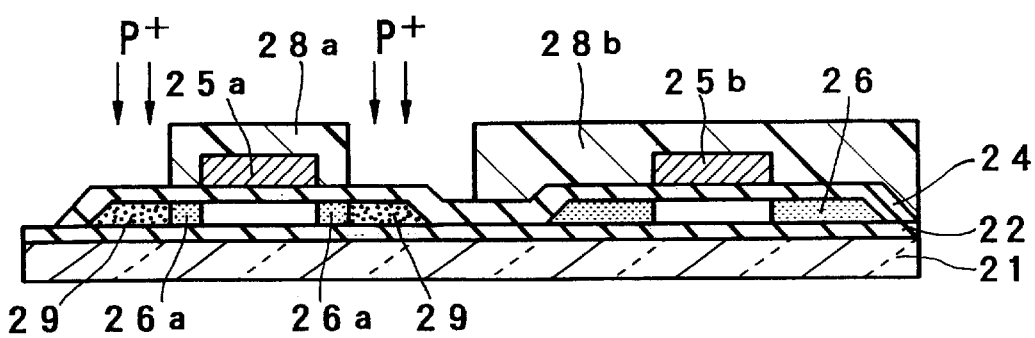

After that, a photoresist is applied to the entire substrate surface and further patterned, to form a photoresist pattern 28a for covering the n-type TFT gate electrode 25a and a region to be formed as a low-concentration source/drain region 26a and another photoresist pattern 28b for covering the p-type TFT gate electrode 25b and a region to be formed as the P-type TFT region, as shown in FIG. 11D. Further, P ions are doped at a doping rate of $1 \times 10^{15}$ $cm^{-2}$ with the photoresist pattern 28a/28b as masks and by use of the ion doping system, to form a high-concentration source/drain region 29, as shown in FIG. 11D. In this process, doping is effected in accordance with one of the doping methods as explained in the first to third embodiments.

Figure 12A:
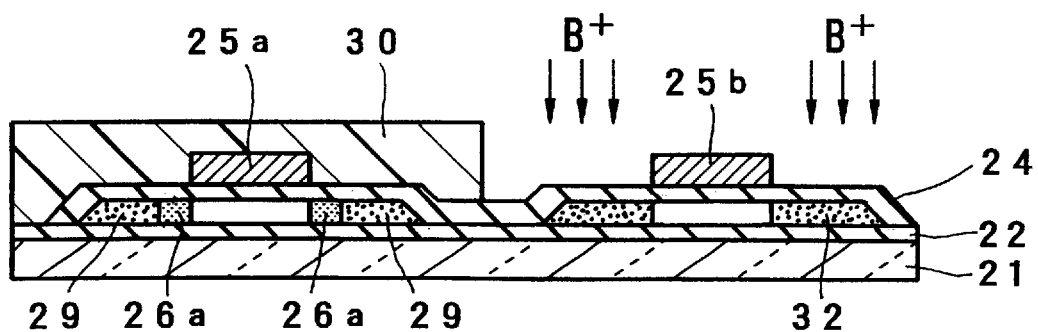
FIGS. 12A to 12B are cross-sectional views for explaining the fourth embodiment of the invention.

After the photoresist pattern 28a/28b has been removed, another photoresist is applied to the entire surface of the substrate, and the applied photoresist is patterned to form a photoresist 30 for covering a region to be formed as an n-type TFT, as shown in FIG. 12A. Further, B ions are doped at a doping rate of $1 \times 10^{15}$ $cm^{-2}$ with the photoresist pattern 30 and the gate electrode 25b as a mask and by use of the ion doping system, to form source and drain regions 32 for a p-type TFT, as shown in FIG. 12A. Further, in this process, doping is effected in accordance with one of the doping methods as explained in the first to third embodiments.

Figure 12B:
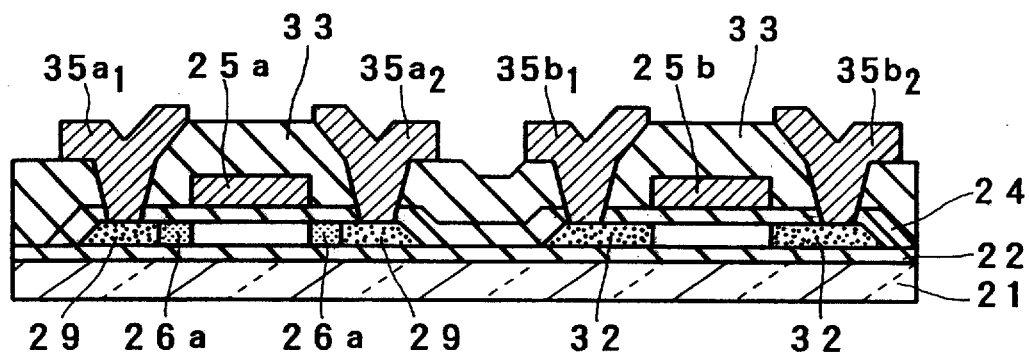

After the resist pattern 30 has been removed, an insulator film 33 formed of $SiO_2$, for instance is deposited, as shown in FIG. 12B. After the doped impurities have been activated at about 600° C., contact holes of the source regions and the drain regions of the TFTs are formed in the insulator film 33 and the gate insulating film 24 in accordance with lithography technique. After that, an Al film is deposited on the entire surface of the substrate so as to bury the contact holes by sputtering, and the deposited Al film is patterned to form a source electrode $35a_1$ and a drain electrode $35a_2$ of the n-type TFT and a source electrode $35b_1$ and a drain electrode $35b_2$ of the p-type TFT.

As described above, in the fourth embodiment of the invention, the same effect as with the case of the first to third embodiments can be obtained.

A fifth embodiment of the present invention will be described hereinbelow with reference to FIGS. 13A to 13F and FIGS. 14A to 14D. In this fifth embodiment, two CMOSFETs of bottom gate type having a conductive layer formed of poly-crystal silicon can be manufactured.

Figure 13A:
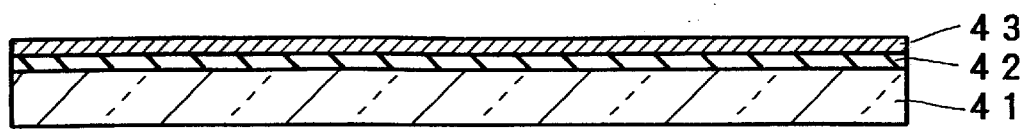
FIGS. 13A to 13F are cross-sectional views for explaining a fifth embodiment of the invention.
Figure 13B:
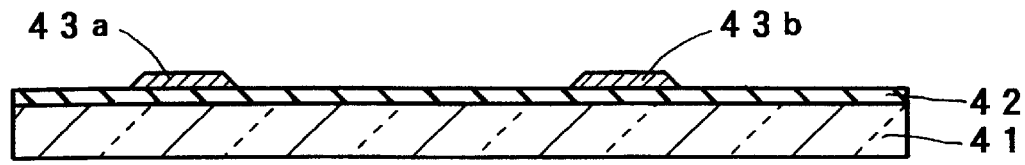

First, after an under-coat film 42 formed of $SiO_2$ has been formed on a glass substrate 41, a metallic film 43 formed of MoTa, for instance is formed by sputtering method, as shown in FIG. 13A. Further, the metallic film 43 is patterned to form a gate electrode 43a of an n-type TFT and a gate electrode 43b of a p-type TFT, as shown in FIG. 13B.

Figure 13C:
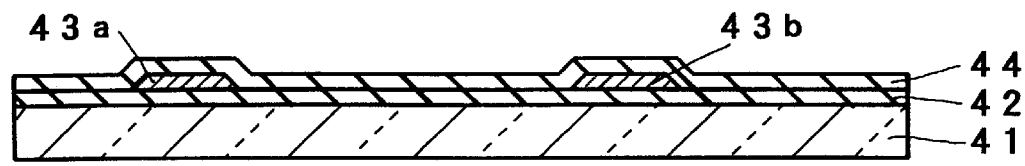
Figure 13D:
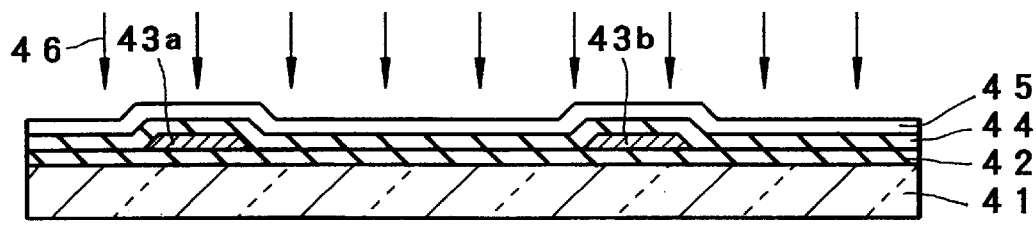

After that, a gate insulating film 44 formed of $SiO_2$ and having a thickness of 400 nm is formed over the entire surface of the substrate, as shown in FIG. 13C. Further, an amorphous silicon film having a thickness of 100 nm is formed on the gate insulating film 44. After that, the formed amorphous silicon is irradiated with an excimer laser light 46 to change the formed amorphous silicon into a poly-crystal silicon film 45, as shown in FIG. 13D.

Figure 13E:
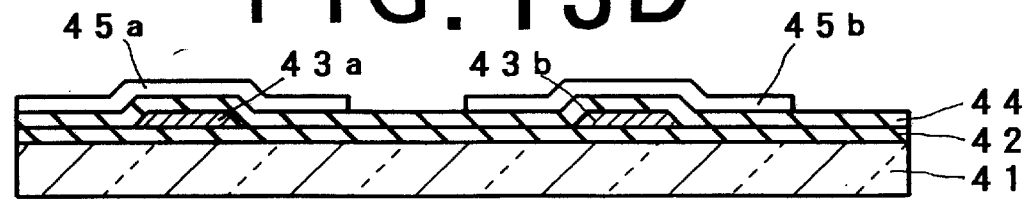
Figure 13F:
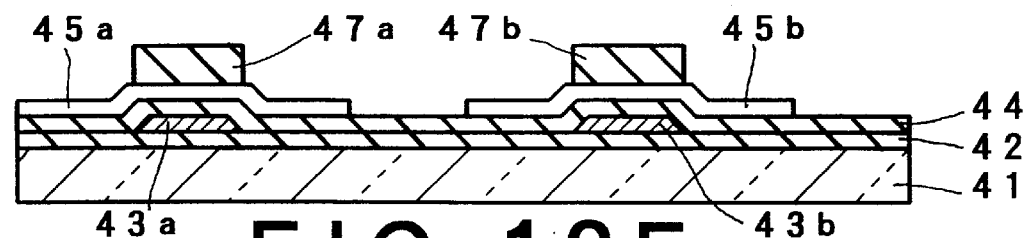

The poly-crystal silicon film 45 is patterned to form a poly-crystal silicon layer 45a to be formed as a conductive layer for an n-type TFT and a poly-crystal silicon layer 45b to be formed as a conductive layer for a p-type TFT, as shown in FIG. 13E. After that, a SiO$_2$ film having a thickness of 400 nm is deposited on the entire surface of the substrate, and then the formed SiO$_2$ film is patterned to form a SiO$_2$ film 47a/47b having the same area as that of the gate electrode 43a/43b on the gate electrode 43a/43b, respectively, as shown in FIG. 13F.

Figure 14A:
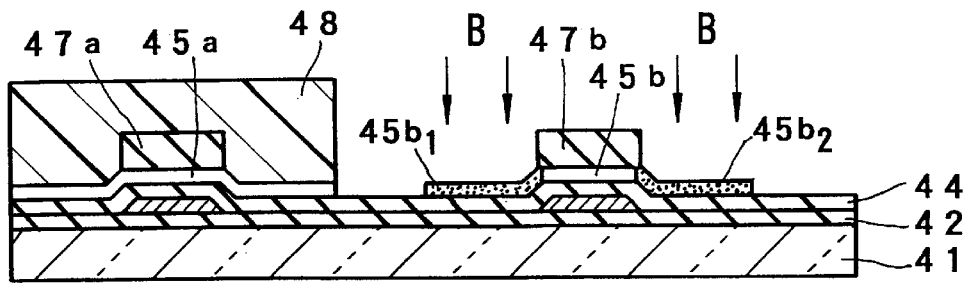
FIGS. 14A to 14D are cross-sectional views for explaining the fifth embodiment of the invention.

After a photoresist has been applied to the entire surface of the substrate, the applied photoresist is patterned, to form a resist pattern 48 for covering a region to be formed as an n-type TFT, as shown in FIG. 14A. Further, B ions are doped to the poly-crystal silicon layer of the p-type TFT region with the photoresist pattern 48 and the SiO$_2$ layer 47b as a mask by use of the ion doping system, to form a source region 45b$_1$ and a drain region 45b$_2$ of the p-type TFT, as shown in FIG. 14A.

Figure 14B:
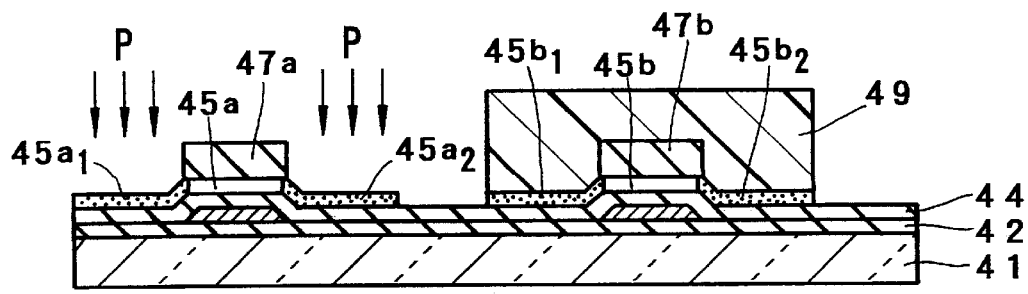

After the resist pattern 48 has been removed, another photoresist is applied to the entire surface of the substrate, and then the applied photoresist is patterned, to form a resist pattern 49 for covering a region to be formed as a p-type TFT, as shown in FIG. 14B. Further, P ions are doped to the poly-crystal silicon layer 45a of the n-type TFT region with the resist pattern 49 and the SiO$_2$ layer 47a as a mask and by use of the ion doping system, to form a source region 45a$_1$, and a drain region 45a$_2$ of the n-type TFT, as shown in FIG. 14B.

Figure 14C:
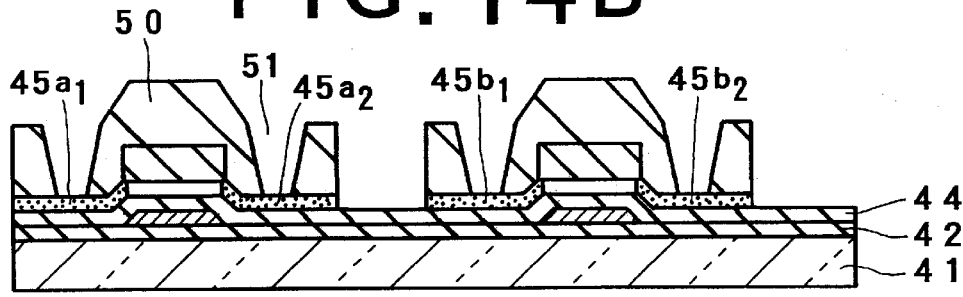
Figure 14D:
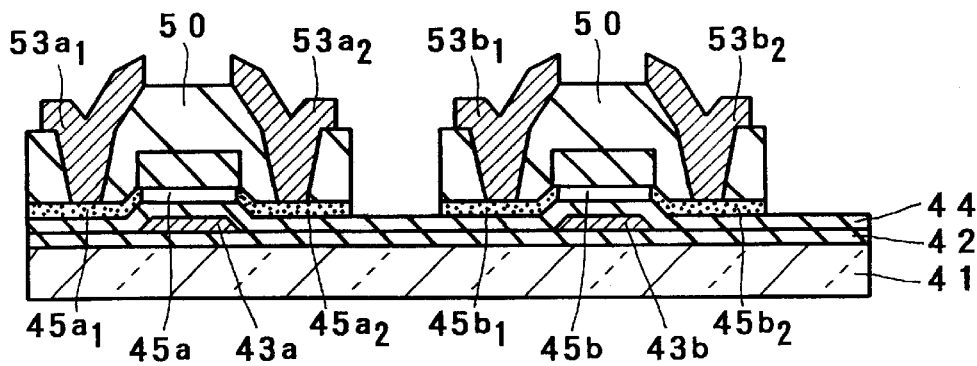

After the resist pattern 49 has been removed, an insulator film 50 formed of SiO$_2$, for instance and having a thickness of 400 nm is formed over the entire surface of the substrate. Further, contact holes of the source regions and the drain regions of the two TFTs are formed in the insulator film 50 in accordance with lithography technique, as shown in FIG. 14C. After that, an Al film is deposited on the entire surface of the substrate so as to bury the contact holes by sputtering, and the deposited Al film is patterned to form a source electrode 53a$_1$ and a drain electrode 53a$_2$ of the n-type TFT and a source electrode 53b$_1$ and a drain electrode 53b$_2$ of the p-type TFT, thus the TFTs being formed completely, as shown in FIG. 14D.

Further, in the fifth embodiment, impurities of P ions and B ions are doped in accordance with one of the doping methods as explained in the first to third embodiments.

As described above, in the fourth embodiment of the invention, the same effect as with the case of the first to third embodiments can be obtained.

Figure 15:
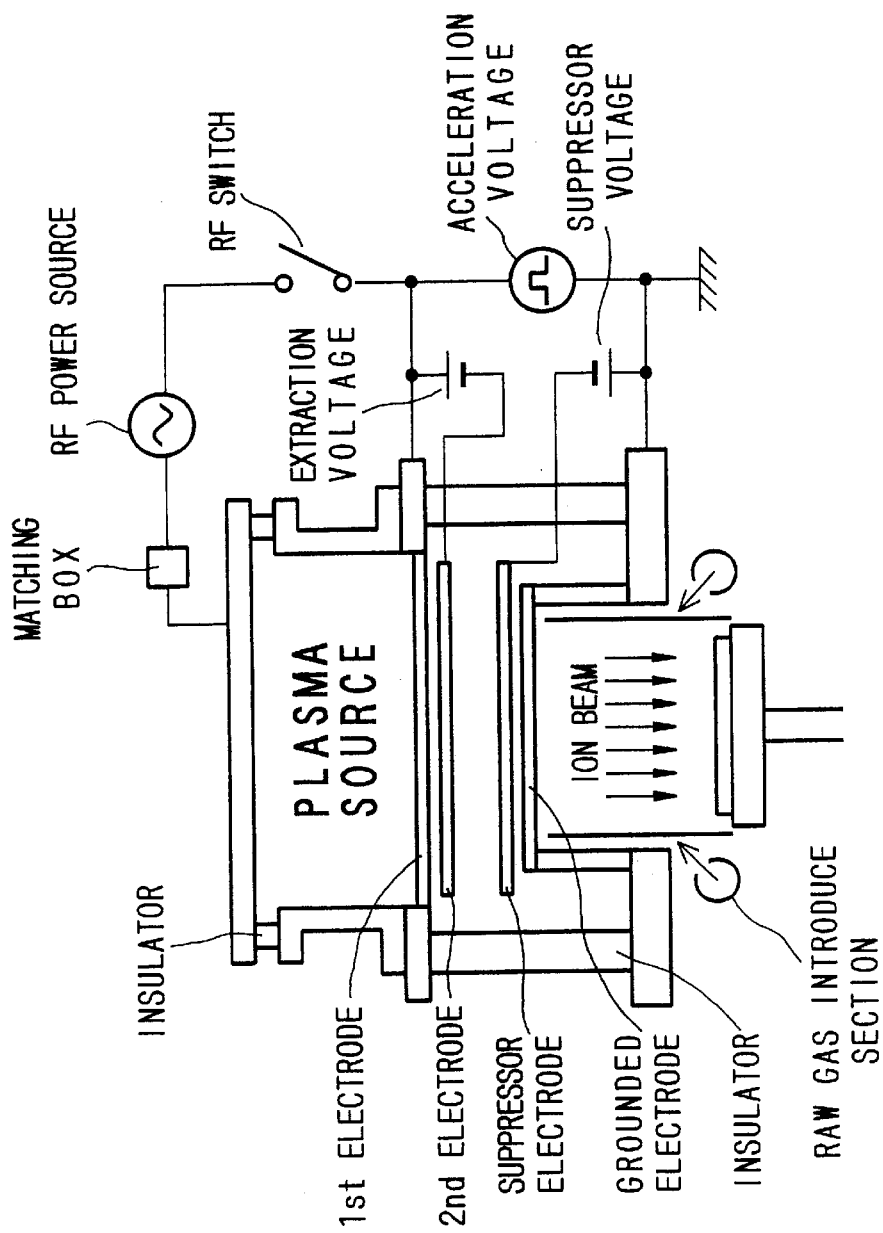
FIG. 15 is a cross-sectional view showing an ion doping system used for the manufacturing method according to the invention.

Here, the ion doping system used for the first to fifth embodiments of the invention will be explained in detail hereinbelow with reference to FIGS. 15 and 16. FIG. 15 shows the cross section of the ion doping system, and FIG. 16 shows a timing chart of plasma ion generation, extraction voltage, and acceleration voltage during the ion doping.

Figure 16:
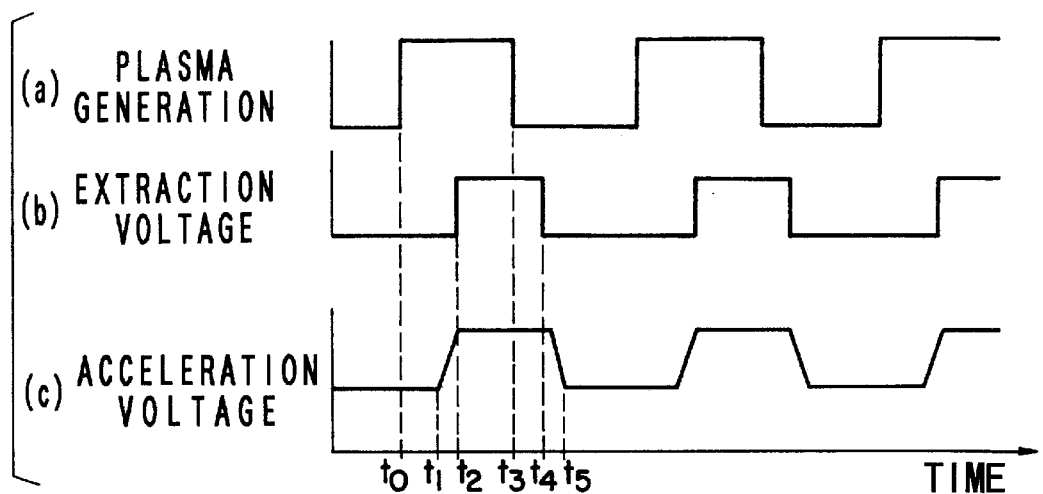
FIG. 16 is a timing chart of the plasma generation, extraction voltage, and acceleration voltage of the ion doping system shown in FIG. 15.

In FIGS. 15 and 16, when a RF (Radio Frequency) switch is turned on, a RF power is introduced to a plasma chamber, so that plasma is generated (at a time t$_0$). After that, when an acceleration voltage is applied to the first electrode (at a time t$_1$) and further a extraction voltage is applied between the first electrode and a second electrode (at a time t$_2$), an ion irradiation starts. On the other hand, at the end of the ion beam irradiation, first the RF switch is turned off to stop generating the plasma (at a time t$_3$) and further the acceleration voltage is zeroed (at a time t$_5$). Therefore, in the above-mentioned ion doping system, only when the extraction voltage is applied during the plasma generation (a period between t$_2$ and t$_3$), an ion beam can be irradiated. Therefore, as compared with the prior art instrument such that an ion beam can be irradiated when any one of the acceleration voltage and the extraction voltage is applied, it is possible to shorten the irradiation time. As a result, even if the substrate is irradiated with the ion beam by use of a large current, the substrate temperature is not easily heated to a high temperature. Further, since the substrate is irradiated with the ion beam by use of a large current, the temperature on the substrate rises, so that doped impurity atoms can be rearranged and thereby activated.

Figure 17:
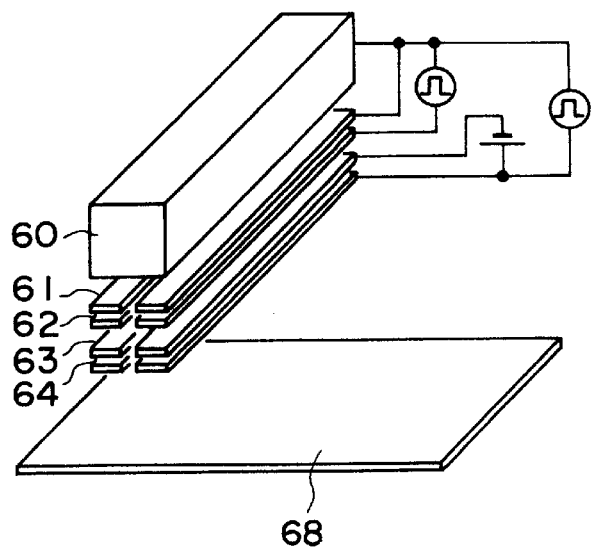
FIG. 17 is a perspective view showing another ion doping system used for the invention.

FIG. 17 shows another example of the ion doping system used for the present invention. In FIG. 17, a first electrode 61, a second electrode 62, a suppressor electrode 63 and a ground electrode 64 are all arranged between a plasma chamber 60 and the substrate 68. Further, each of these electrodes is formed with a central slit through which the substrate 68 can be irradiated with ion plasma. Accordingly, since the ion beam can be generated in a linear shape, the heat generated during doping can be released in the substrate 68, so that a still larger current can be used.

The substrate cooling mechanism used for the invention will be described hereinbelow with reference to the attached drawings.

Figure 18:
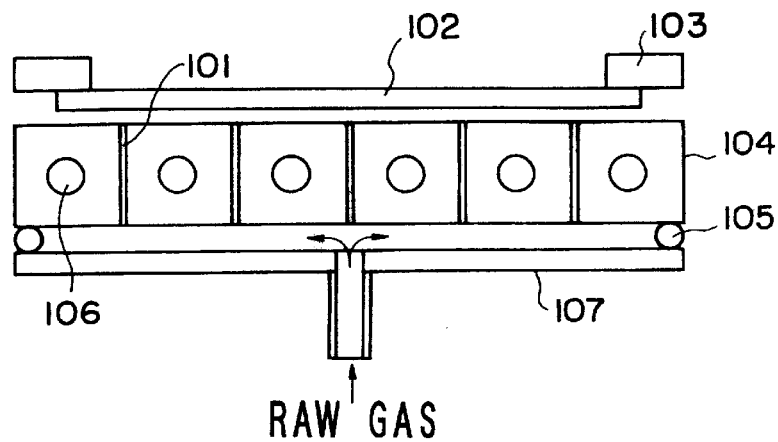
FIG. 18 is a cross-sectional view showing a first example of a substrate cooling mechanism used in the invention.

FIG. 18 shows a first example thereof. The substrate cooling mechanism shown in FIG. 18 is used to cool the reverse side of a substrate 102. Further, to cool the substrate, PH$_3$ or B$_2$H$_6$ gas diluted by hydrogen used as a raw gas for doping is utilized.

In FIG. 18, the substrate 18 is fixed by a substrate holder 103. The raw gas is fed to a cooling stage 104 through a hole formed passing through a back plate 107, and further to the reverse side of the substrate 102 thorough a plurality of cooling gas introduction holes 101 formed in the cooling stage 104. When the gas is passing through the cooling gas introduction holes 101, the gas is cooled by a cooling water pipe 106 arranged in the cooling stage 104.

Therefore, the reverse side of the substrate 102 is kept at a low vacuum and further filled with hydrogen gas. Here, since the heat conductivity of hydrogen gas is high, the heat of the substrate 102 can be conducted to the cooling stage 104 effectively. Accordingly, it has become possible to increase thermal contact between the substrate 102 and the cooling stage 104 (so far difficult to increase the thermal contact between the two), with the result that the cooling effect of the substrate can be increased.

Further, since raw gas is used as the cooling gas, even if this cooling gas leaks into the ion implantation chamber of the ion doping system, the leaked cooling gas is diffused under a roughly uniform pressure within the ion implantation chamber and the ion source of the ion doping system, and further plasmalized or ionized by the ion source, so that the leaked cooling gas can be implanted into the substrate 102. In other words, even if the cooling gas leaks into the implantation chamber, the leaked cooling gas exerts no harmful influence upon the ion doping system. Further, a space between the back plate 107 and the cooling stage 104 is sealed by use of an appropriate sealing member.

Figure 19:
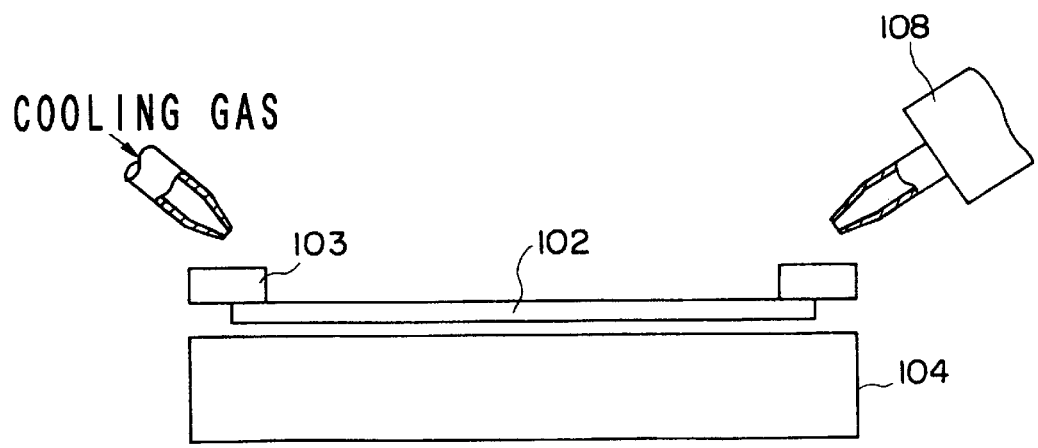
FIG. 19 is a cross-sectional view showing a second example of a substrate cooling mechanism used in the invention.

FIG. 19 shows a second example of the substrate cooling mechanism. In the substrate cooling mechanism shown in FIG. 19, the reverse side of a substrate 102 held by a substrate holder 103 is cooled by use of a cooling stage 104, and further the right side of the substrate 102 is cooled by jetting a cooling gas obtained through an ionizer 108. In the same way as with the case of the prior art instrument, a cooling pipe (not shown) is arranged within the cooling stage 104, so that the reverse side of the glass substrate 102 can be cooled by flowing water through this cooling pipe. Further, the cooling gas is jetted through the an ionizer 108 between the two ion beam irradiations, that is, when the ion beam is not being irradiated.

Figure 20:
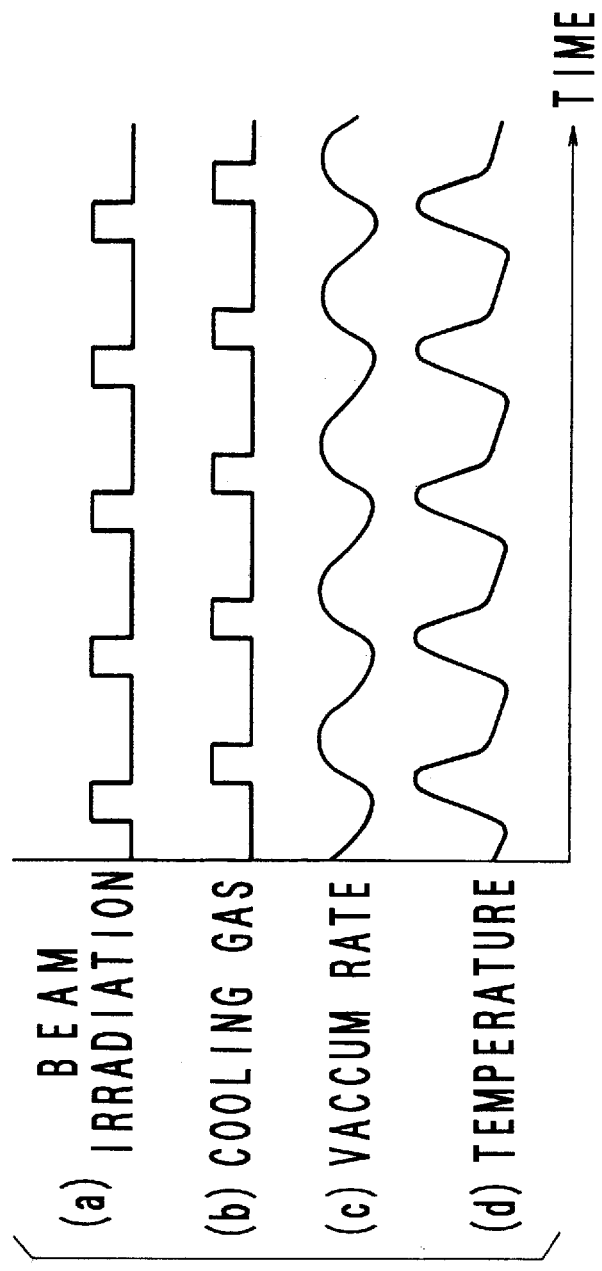
FIG. 20 is a timing chart of the second example of a substrate cooling mechanism used in the invention.

FIG. 20 shows a timing chart of the second example of the cooling mechanism. In FIG. 20, immediately after the strong ion beam irradiation ends, the cooling gas is allowed to flow on the surface of the substrate 102, so that the temperature of the substrate 102 can be lowered sharply. After that, when the cooling gas is stopped, the cooling speed of the substrate 102 drops. In this case, however, the vacuum degree can be increased. Therefore, when the vacuum degree increases to a range in which the plasma can be generated, plasma is generated to irradiate an ion beam.

Figure 21:
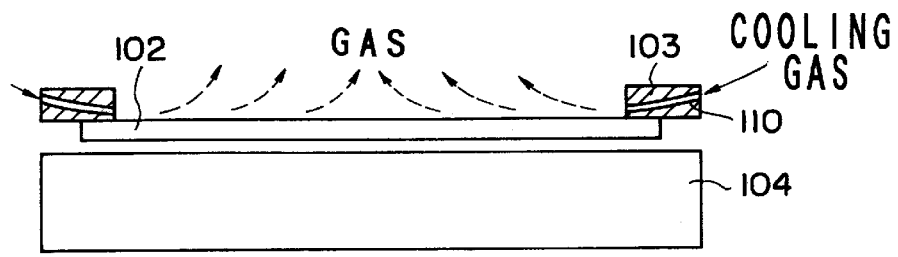
FIG. 21 is a cross-sectional view showing a third example of a substrate cooling mechanism used in the invention.

FIG. 21 shows a third example of the substrate cooling mechanism. Cooling gas is jetted onto the substrate surface through holes 110 formed in the substrate holder 103, respectively, instead of the ionizer 108 provided for the substrate cooling mechanism of the second example shown in FIG. 19. In this example, since the cooling gas can be allowed to flow along the substrate surface more easily, as compared with the second example, it is possible to cool the substrate more effectively.

Figure 22:
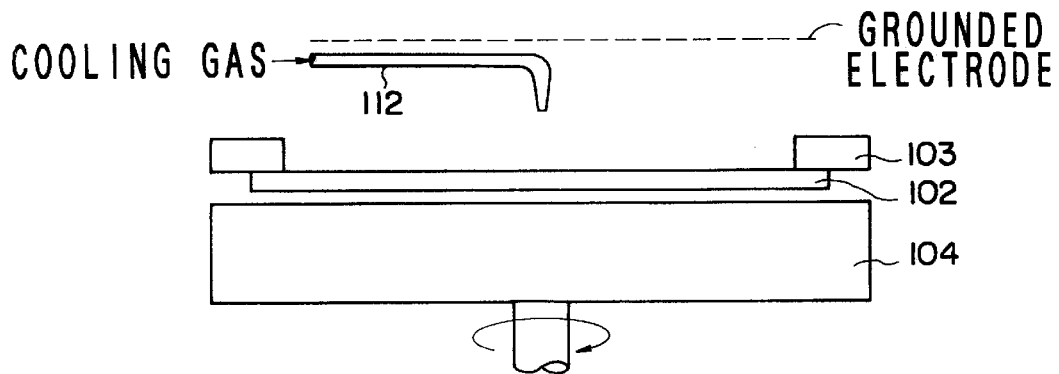
FIG. 22 is a cross-sectional view showing a fourth example of a substrate cooling mechanism used in the invention.

FIG. 22 shows a fourth example of the substrate cooling mechanism. In the substrate cooling mechanism shown in FIG. 22, the glass substrate 102 held by the substrate holder 103 is rotated together with the cooling stage 104. Further, the cooling gas is jetted onto the center of the rotating substrate 102 through a nozzle 112 disposed under a grounded electrode (as shown in FIG. 15) of the ion doping system. In this example, since the cooling gas flows from the center to the circumference of the substrate along the substrate surface, the cooling effect can be further increased. Further, the reverse side of the substrate 102 is cooled by the cooling water flowing through the cooling pile disposed in the cooling stage 104, in the same way as with the case of the second and third embodiments.

Figure 23:
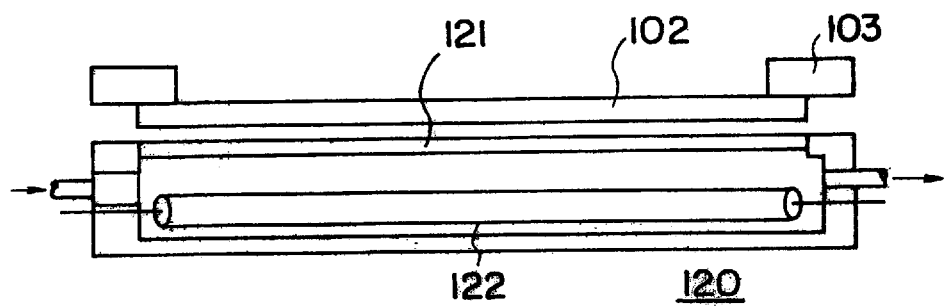
FIG. 23 is a cross-sectional view showing a heating device used in the invention.

A fifth example of the substrate cooling mechanism will be described hereinbelow with reference to FIGS. 23, 24A and 24B. In this fifth example of the substrate cooling mechanism, a heating device 120 as shown in FIG. 23 is provided, instead of the cooling stage 104. Further, the substrate is cooled by natural heat radiation. Before cooling the reverse side of the substrate 102, the reverse side of the substrate 102 is heated by use of the heating device 120 as shown in FIG. 23.

Figure 24A:
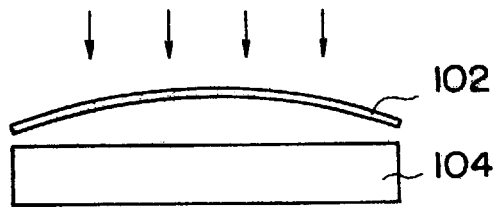
FIG. 24A is an illustration explaining the problem caused when ion doping is effected without heating before cooling.
Figure 24B:
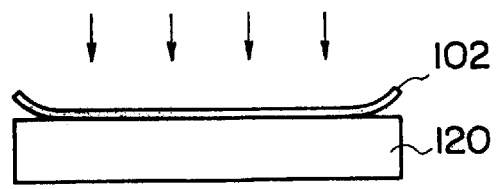
FIG. 24B is an illustration explaining the effect obtained when ion doping is effected by cooling, after heated by use of the heating device as shown in FIG. 23.

In the prior art insrumenet, when the substrate is not heated before cooling the substrate, since the substrate 102 is deformed into a convex shape relative to the cooling stage 104, as shown in FIG. 24A, by the ion doping onto the surface of the substrate 102, a gap is produced between the substrate 102 and the cooling stage 104, so that there exists a problem in that the substrate cannot be cooled effectively. To overcome this problem, before the substrate 102 is cooled, when the reverse side of the substrate 102 is heated, since the substrate 102 can be deformed into a concave shape relative to a metallic plate 121 of the heating device 120, as shown in FIG. 24B, the substrate 102 can be brought into tight contact with the heating device 120, with the result that the substrate can be cooled more effectively.

Further, in the heating device shown in FIG. 23, when the reverse side of the substrate 102 is heated by a halogen heater 122 disposed in a He gas atmosphere, via the metallic plate 121 disposed between the halogen heater 122 and the reverse side of the glass substrate 102, the reverse side of the substrate 102 can be brought into tight contact with the metallic plate 121. After that, even if the substrate 102 is doped, the temperature of the substrate 102 drops largely, as compared with the case where the heating device is not used as with the case of the prior art instrument. Therefore, when the dope rate is about $1\times10^{16}$ cm$^{-2}$, although the temperature of the substrate 102 rises up to about 350° C. in the prior art cooling method, when this heating device is used, the substrate temperature can be cooled down to about 200° C. or lower. The reason may be as follows: since the substrate 102 can be brought into tight contact with the metallic plate 121 of the heating device 120, when heat is generated by the ion beam irradiation, the generated heat can be conducted to the heating device of large heat capacity via the metal plate 121.

Figure 25:
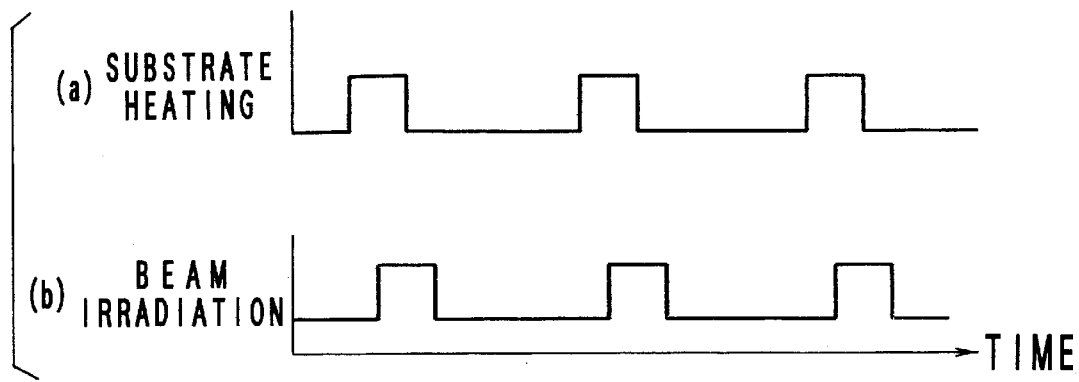
FIG. 25 is a timing chart of the substrate heating and ion beam irradiation by use of the heating device shown in FIG. 23.

Further, FIG. 25 shows a timing chart of the substrate heating and the ion beam irradiation. FIG. 25 indicates that after heated, the substrate is cooled; then the substrate is irradiated with the ion beam; the substrate heating ends during the ion beam irradiation; and lastly during the ion beam irradiation, the substrate is cooled by natural radiation.

Figure 26:
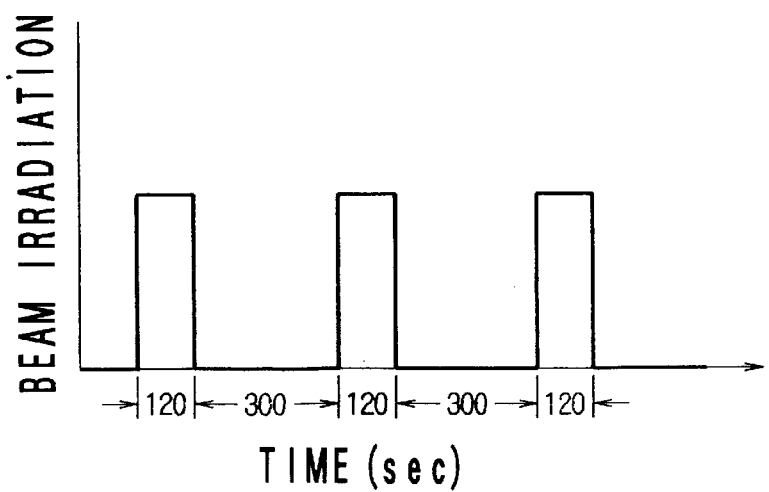
FIG. 26 is a graphical representation showing other doping characteristics of the invention.

Although the beam current has been passed intermittently on the basis of the substrate temperature, it is possible to control the intermittence of the beam current without detecting the substrate temperature. For instance, in the case of the thin film transistor where the doping is effected for 600 sec continuously by use of the aluminum mask, the ion beam irradiation period for 120 sec and the cooling period for 300 sec are repeated alternately, as shown in FIG. 26. In this case, the two time intervals are determined appropriately according to the cooling capacity of the substrate cooling mechanism.

As described above, according to the present invention, it is possible to dope impurities at microscopic regions, and further to obtain the highest possible throughput.

What is claimed is:

1. A method of manufacturing a thin film transistor, comprising the steps of:

a first step for forming a poly-crystal silicon film on a substrate and then patterning the formed poly-crystal silicon film to form a layer to be formed as a conductive layer for the thin film transistor;

a second step for doping impurity ions at the layer to be formed as the conductive layer at a first acceleration voltage and a first beam current;

a third step for cooling the substrate by a cooling mechanism after the second step; and a fourth step for forming a source region and a drain region, respectively in the conductive layer by repeating the second and third steps.

2. The method of manufacturing a thin film transistor of claim 1, wherein the third step further comprises the step of doping impurity ions at a second acceleration voltage and a second beam current, when the substrate is being cooled, at least one of the second acceleration voltage and the second beam current being lower than that associated with the second step.

3. The method of manufacturing a thin film transistor of claim 1, wherein the second step further comprises the step of measuring a temperature of the substrate, and the step of interrupting the doping operation when the substrate temperature reaches a predetermined temperature below the temperature at which the photoresist hardens.

4. The method of manufacturing a thin film transistor of claim 1, wherein the cooling mechanism operates intermittently, and the doping at the second step is performed intermittently at time intervals according to the cooling mechanism.

5. The method of manufacturing a thin film transistor of claim 1, wherein the substrate is cooled by cooling a reverse side of the substrate by use of cooling water.

6. The method of manufacturing a thin film transistor of claim 1, wherein the substrate is cooled by blowing a cooling gas onto a surface of the substrate.

7. The method of manufacturing a thin film transistor of claim 2, wherein the second step further comprises the step of measuring a temperature of the substrate, and the step of interrupting the doping operation when the substrate temperature reaches a predetermined temperature below the temperature at which the photoresist hardens.

8. The method of manufacturing a thin film transistor of claim 2, wherein the cooling mechanism operates intermittently, and the doping at the second step is performed intermittently at time intervals according to the cooling mechanism.

9. The method of manufacturing a thin film transistor of claim 2, wherein the substrate is cooled by cooling a reverse side of the substrate by use of cooling water.

10. The method of manufacturing a thin film transistor of claim 2, wherein the substrate is cooled by blowing a cooling gas onto a surface of the substrate.

11. The method of manufacturing a thin film transistor of claim 3, wherein the substrate is cooled by cooling a reverse side of the substrate by use of cooling water.

12. The method of manufacturing a thin film transistor of claim 3, wherein the substrate is cooled by blowing a cooling gas onto a surface of the substrate.

13. The method of manufacturing a thin film transistor of claim 4, wherein the substrate is cooled by cooling a reverse side of the substrate by use of cooling water.

14. The method of manufacturing a thin film transistor of claim 4, wherein the substrate is cooled by blowing a cooling gas onto a surface of the substrate.

15. The method of manufacturing a thin film transistor of claim 5, wherein the substrate is further cooled by exposing the reverse side of the substrate in a gas atmosphere including hydrogen gas.

* * * * *